(12) United States Patent
Froidevaux et al.

(10) Patent No.: US 11,509,305 B2
(45) Date of Patent: Nov. 22, 2022

(54) SWITCHABLE DIODE DEVICES HAVING TRANSISTORS IN SERIES

(71) Applicant: STMicroelectronics (Rousset) SAS, Rousset (FR)

(72) Inventors: Nicolas Froidevaux, Aix en Provence (FR); Laurent Lopez, Peynier (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 17/411,838

(22) Filed: Aug. 25, 2021

(65) Prior Publication Data

US 2021/0384903 A1 Dec. 9, 2021

Related U.S. Application Data

(63) Continuation of application No. 16/856,448, filed on Apr. 23, 2020, now Pat. No. 11,133,798.

(30) Foreign Application Priority Data

Apr. 26, 2019 (FR) ...................................... 1904484

(51) Int. Cl.
*H03K 17/687* (2006.01)
*H03K 17/30* (2006.01)

(52) U.S. Cl.
CPC ....... *H03K 17/6872* (2013.01); *H03K 17/302* (2013.01); *H03K 17/6871* (2013.01)

(58) Field of Classification Search
CPC ....... H03K 17/6872; H03K 19/018592; H03K 19/018507; H03K 17/302; H03K 19/00315; H03K 19/017545; H03K 17/6871; H03K 17/6877; H03K 17/785; H03K 17/08; H03K 3/012; H03K 3/013; H03K 3/017; H03K 3/0375; H03K 3/356052; H03K 3/356086; H03K 3/356104; H03K 3/356113; H03K 3/35625

See application file for complete search history.

(56) References Cited

U.S. PATENT DOCUMENTS

| | | | |
|---|---|---|---|
| 4,858,055 A * | 8/1989 | Okitaka | H01L 27/0251 327/318 |
| 5,118,968 A | 6/1992 | Douglas et al. | |
| 5,723,990 A | 3/1998 | Roohparvar | |
| 5,745,323 A | 4/1998 | English et al. | |
| 5,880,617 A | 3/1999 | Tanaka et al. | |

(Continued)

*Primary Examiner* — Jung Kim
(74) *Attorney, Agent, or Firm* — Slater Matsil, LLP

(57) ABSTRACT

An electronic chip includes a chip core including an input terminal, an output terminal, an external pad, and an input-output circuit coupled to the chip core and the external pad. The input-output circuit includes an enable terminal coupled to the chip core, a connection terminal coupled to the external pad, a switchable diode device coupled between a supply voltage and a reference voltage, and a levelling circuit. The switchable diode device is coupled to the connection terminal and the enable terminal and is configured to operate as a diode in response to a control signal in a first state applied to the enable terminal and to operate as an open circuit in response to the control signal in a second state applied to the enable terminal. The levelling circuit is coupled to the connection terminal, the input terminal of the chip core, and the output terminal of the chip core.

20 Claims, 3 Drawing Sheets

(56) References Cited

U.S. PATENT DOCUMENTS

| | | |
|---|---|---|
| 6,946,892 B2 | 9/2005 | Mitarashi |
| 7,446,589 B2 | 11/2008 | Ijitsu |
| 2019/0007031 A1 | 1/2019 | Kwon et al. |

* cited by examiner

SWITCHABLE DIODE DEVICES HAVING TRANSISTORS IN SERIES

CROSS-REFERENCE TO RELATED APPLICATIONS

This application is a continuation application of U.S. application Ser. No. 16/856,448, filed on Apr. 23, 2020, now U.S. Pat. No. 11,133,798, which application claims priority to French Patent Application No. 1904484, filed on Apr. 26, 2019, which applications are hereby incorporated herein by reference in their entirety.

TECHNICAL FIELD

The present disclosure relates generally to electronic devices and, more specifically, to chips integrating one or more input-output circuits comprising connection pads.

BACKGROUND

Input-output circuits, integrated in a chip, that comprise so-called "intolerant" connection pads are known. These intolerant pads typically have means of protection against possible current injections. The current injections via connection pads can, in certain cases, produce harmful effects for the chip. It is thus desirable to guard against these current injections, generally by using diodes. One of the drawbacks linked to the use of these diodes stems from the fact that this restricts a range of input voltages admissible by the circuit. This restriction sometimes turns out to be detrimental to certain applications, for which a larger range of voltages is desirable.

Input-output circuits comprising so-called "tolerant" connection pads are also known. By means of these circuits equipped with tolerant pads, it is possible, compared to circuits equipped with intolerant pads, to expand the range of admissible input voltages without risking a degradation of the chip as well as of the signal applied on the pad. It is in particular possible, for specific applications, to bring these tolerant pads to electrical potentials substantially higher than a supply potential for supplying the chip. The intolerant pads cannot, however, in certain applications, be replaced by tolerant pads.

Currently, a decision is made before the manufacture of the chip regarding which type (tolerant or intolerant pad) the pad of each input-output circuit will be. This decision is, most of the time, conditioned by the target applications. Once the chip has been manufactured, the type of pad of each input-output circuit is no longer modifiable. This thus imparts a poor flexibility to existing input-output circuits.

SUMMARY

Embodiments provide flexibility of existing input-output circuits.

One embodiment addresses all or some of the drawbacks of known input-output circuits.

One embodiment provides a device comprising, in series, a first transistor, a second transistor, connected to the first transistor and a third transistor, connected to the second transistor, said third transistor being controlled by a digital signal.

According to an embodiment, the transistors are MOS transistors.

According to an embodiment the first transistor is a P-type transistor, the second transistor is an N-type transistor and the third transistor is an N-type transistor.

According to an embodiment the drain of the second transistor is connected to the drain of the first transistor and the source of the second transistor is connected to the drain of the third transistor.

According to an embodiment, a reference potential is applied on the source of the third transistor.

According to an embodiment, a DC voltage is applied between the common gates of the first and second transistors and the source of the third transistor.

According to an embodiment, the digital signal is adapted to control, in an ON/OFF manner, the passage of a current in the association in series.

According to an embodiment, the association in series forms, as a function of the state of the digital signal controlling the third transistor, sometimes a diode and sometimes an open circuit.

One embodiment provides a device comprising exclusively three transistors as described.

One embodiment provides an electronic chip comprising at least one such device.

According to an embodiment, the source of the first transistor of said device is coupled to at least one connection pad of the chip.

According to an embodiment, a supply voltage of the chip is applied between the common gates of the first and second transistors and the source of the third transistor.

One embodiment provides a method for controlling such a device, wherein the digital control signal is placed in a first state for imparting a diode function and the digital control signal is placed in a second state for forcing an open circuit.

BRIEF DESCRIPTION OF THE DRAWINGS

The foregoing features and advantages, as well as others, will be described in detail in the following description of specific embodiments given by way of illustration and not limitation with reference to the accompanying drawings, in which.

Like features have been designated by like references in the various figures. In particular, the structural and/or functional features that are common among the various embodiments may have the same references and may have identical structural, dimensional and material properties.

DETAILED DESCRIPTION OF ILLUSTRATIVE EMBODIMENTS

For the sake of clarity, only the operations and elements that are useful for an understanding of the described embodiments herein have been illustrated and described in detail. In particular, the generation of the signals to be transmitted by the input-output circuits and the processing of these signals have not been described in detail, the described embodiments being compatible with conventional applications of input-output circuits.

Unless indicated otherwise, when reference is made to two elements that are connected together, this means a direct connection without any intermediate elements other than conductors, and when reference is made to two elements that are linked or coupled together, this means that these two elements can be connected or be linked or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
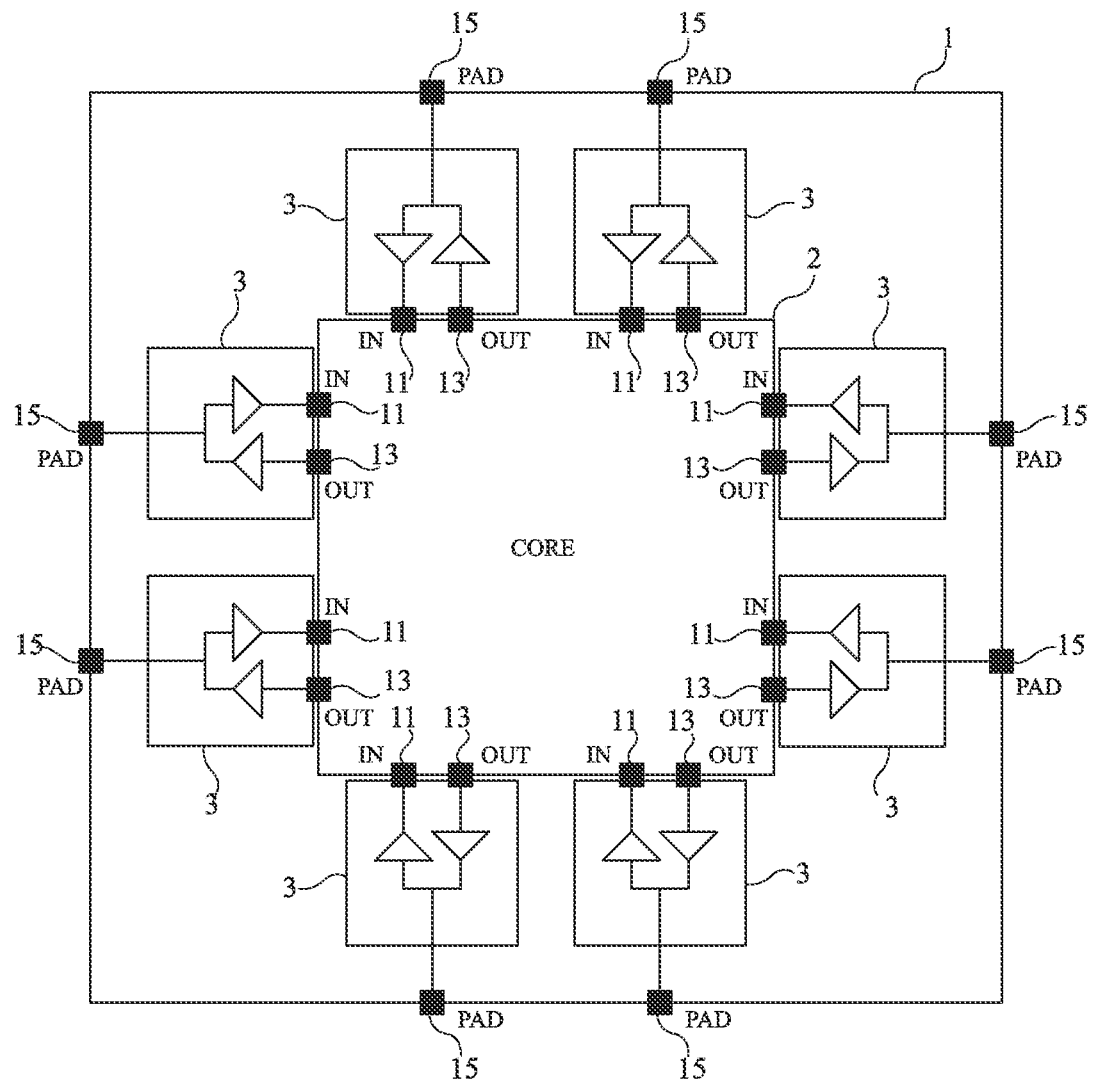
FIG. 1 illustrates, in a schematic fashion, an example electronic chip.

FIG. 1 illustrates, in a schematic fashion, an example electronic chip 1.

In the example shown in FIG. 1, the electronic chip 1 comprises circuits 3 or input-output cells. The input-output circuits 3 allow the core 2 (CORE) of the chip 1 to communicate with the outside. Each input-output circuit 3 is, still in the example shown in FIG. 1, connected to an input terminal 11 (IN) of the core 2 of the chip 1, an output terminal 13 (OUT) of the core 2 of the chip 1 and a pad 15 (PAD) allowing, for example, a connection of the chip 1 to contact elements (not illustrated) located at the surface of a circuit board (not illustrated).

The input-output circuits 3 typically form an input-output ring (I/O ring). These input-output circuits 3 allow, for example, the core 2 of the chip 1 to exchange digital signals with the outside. The input-output circuits 3 generally ensure a protective function against electrostatic discharges capable of damaging the core 2 of the chip 1.

Figure 2:
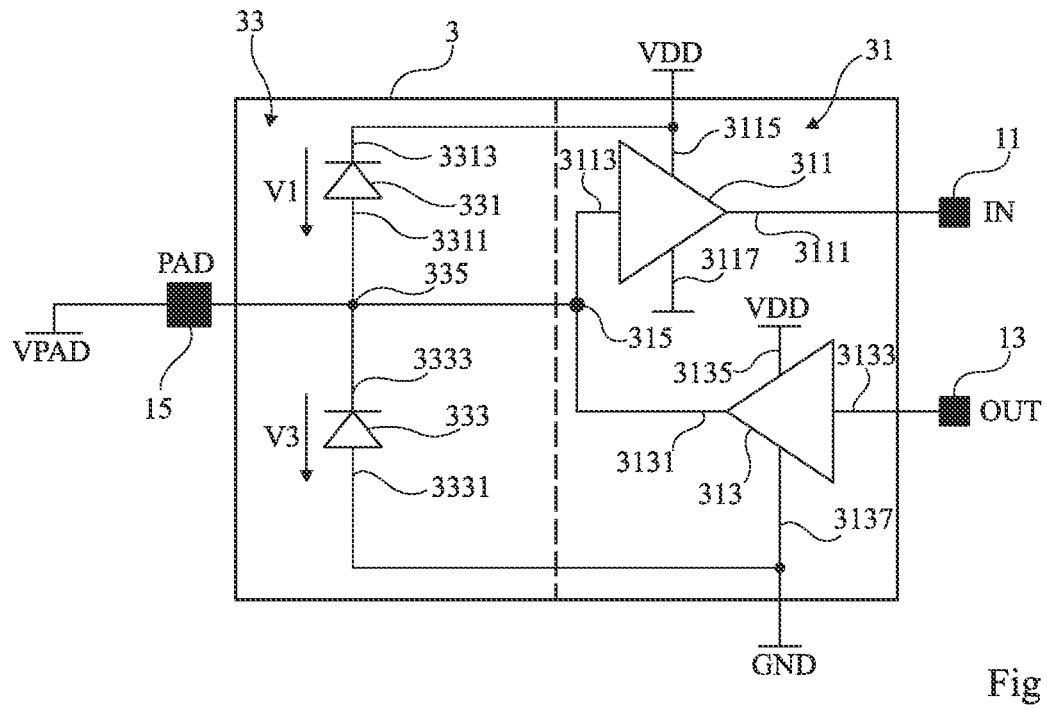
FIG. 2 illustrates, in a schematic fashion, an example input-output circuit of an electronic chip.

FIG. 2 illustrates, in a schematic fashion, an example input-output circuit 3 of an electronic chip.

In the example shown in FIG. 2, the input-output circuit 3 (for example, one of the input-output circuits 3 of the chip 1 as shown in FIG. 1) is composed of a levelling circuit 31, comprising in particular two amplifiers or buffer circuits (buffers) 311 and 313 and of a protective circuit 33, comprising in particular two diodes 331 and 333.

In the following, the buffer circuits 311 and 313 will be designated as amplifiers, although it is clear that they do not necessarily amplify the digital signal applied on their input. Their first function is to bring the high and low input levels to the respective supply potentials of the circuit 311, 313 in question (in the example, the potential VDD and ground GND), with the exception of the drops in voltage in the one or more transistors constituting the circuit 311, 313 in the on state.

An output 3111 of the amplifier 311 of the levelling circuit 31 is, in FIG. 2, connected to the input terminal 11 (IN) of the core 2 (FIG. 1) of the chip 1. An input 3133 of the amplifier 313 is connected to the output terminal 13 (OUT) of the core 2 (FIG. 1) of the chip 1. An output 3131 of the amplifier 313 and an input 3113 of the amplifier 311 are connected to each other, in this example by way of a common connection node 315. This connection node 315 is connected to the connection pad 15 (PAD) of the chip 1.

A positive supply pin 3115 of the amplifier 311 and a positive supply pin 3135 of the amplifier 313 are, in FIG. 2, both brought to a same electrical potential VDD. This potential VDD generally corresponds to a supply voltage of the chip 1 from a supply source (not illustrated). The voltage VDD is typically comprised between 1.8 V and 3.6 V. A negative supply pin 3117 of the amplifier 311 is brought to any electrical potential (not illustrated). A negative supply pin 3137 of the amplifier 313 is brought to a reference potential (typically ground, GND).

In the example shown in FIG. 2, an anode 3311 of the diode 331 of the protective circuit 33 is connected to the connection pad 15 of the chip 1. A cathode 3313 of the diode 331 is connected to the positive supply pin 3115 of the amplifier 311 of the levelling circuit 31. An anode 3331 of the diode 333 is connected to the negative supply pin 3137 of the amplifier 313 of the levelling circuit 31. A cathode 3333 of the diode 333 is connected to the connection pad 15 of the chip 1. The cathode 3313 of the diode 331 is thus brought to the potential VDD while the anode 3331 of the diode 333 is grounded GND. It is assumed in the following, for the purposes of simplification, that the ground potential GND is zero (GND=0 V). The potential GND thus constitutes a reference potential for the circuit 1.

The anode 3311 of the diode 331 and the cathode 3333 of the diode 333 of the protective circuit 33 of the chip 1 are, in FIG. 2, both connected in a further connection node 335. The pad 15, the connection nodes 315 and 335, the anode 3311 of the diode 331, the cathode 3333 of the diode 333, the input 3113 of the amplifier 311 and the output 3131 of the amplifier 313 are thus (with the exception of the drops in parasitic voltages in the conductors) at the potential of the pad PAD, designated as VPAD.

The diodes 331 and 333 of the protective circuit 33 are on, i.e. they let through an electrical current, when they are biased by a voltage greater than a threshold voltage, designated as VSEUIL. It is assumed in the following, for the purposes of simplification, that the diodes 331 and 333 are both characterized by an identical threshold voltage VSEUIL. This threshold voltage VSEUIL is typically in the order of 0.7 V for a silicon diode (PN junction).

For the purposes of simplification, avalanche phenomena potentially occurring in the diodes 331 and 333 in the case of an application of a strong inverse voltage are disregarded. The diode 331 is thus only considered on if a voltage V1 at least equal to the voltage VSEUIL is applied between its anode 3311 and its cathode 3313. Otherwise (if the voltage V1 is strictly lower than the voltage VSEUIL), the diode 331 is considered off, i.e. it does not let any current through. In the example shown in FIG. 2, the voltage V1 is equal to VPAD−VDD.

Similarly, the diode 333 is only considered on if a voltage V3, at least equal to the voltage VSEUIL, is applied between its anode 3331 and its cathode 3333. Otherwise (if the voltage V3 is strictly lower than the voltage VSEUIL), the diode 333 is considered off, i.e. it does not let any current through. In the example shown in FIG. 2, the voltage V3 is equal to −VPAD.

Three cases of operation are thus theoretically possible, as a function of the value of the voltage VPAD, for the input-output circuit 3 in a first case, if the voltage VPAD is strictly comprised between −VSEUIL and VDD+VSEUIL, the diodes 331 and 333 are off (as the voltages V1 and V3 are thus both strictly lower than the voltage VSEUIL), in a second case, if the voltage VPAD is lower than or equal to −VSEUIL, the diode 333 is on (as the voltage V3 is thus greater than or equal to the voltage VSEUIL) while the diode 331 is off (as the voltage V1 is thus strictly lower than the voltage VSEUIL) and in a third case, if the voltage VPAD is greater than or equal to VDD+VSEUIL, the diode 331 is on (as the voltage V1 is thus greater than or equal to the voltage VSEUIL) while the diode 333 is off (as the voltage V3 is thus strictly lower than the voltage VSEUIL).

The first case of operation corresponds to a normal situation. In this situation, the input-output circuit 3 of the chip 1 accommodates, on its pad 15, a range of voltages VPAD comprised between −VSEUIL and VDD+VSEUIL. The pad 15 of the circuit 3 is thus considered an "intolerant pad".

The second case typically corresponds to an abnormal situation due to a negative injection, or negative overvoltage, on the pad 15. The diode 333 being on in this case, a current can thus flow from the ground GND toward the pad 15, which makes it possible to protect the levelling circuit 31 against the negative overvoltage.

The third case typically corresponds to a further abnormal situation due to a positive injection, or positive overvoltage, on the pad 15. The diode 331 being on in this case, a current can thus flow from the pad 15 toward a supply source of the chip 1, which makes it possible to protect the levelling circuit 31 against the positive overvoltage.

The diodes 331 and 333 of the protective circuit 33 thus make it possible to protect the levelling circuit 31 of the input-output circuit 3 against possible overvoltages, positive or negative. The diode 331 constitutes an injection path towards the supply VDD. The diode 333 constitutes an extraction path from the ground GND.

A drawback linked to the implementation of the diodes 331 and 333 resides in the fact that one is forced, during normal operation, to avoid exceeding, on the pad 15 of the chip 1, a voltage VPAD approximately equal to VDD+VSEUIL. This constraint can prevent the chip 1 from being used for applications where there is a need to apply a voltage VPAD substantially greater than VDD+VSEUIL.

Figure 3:
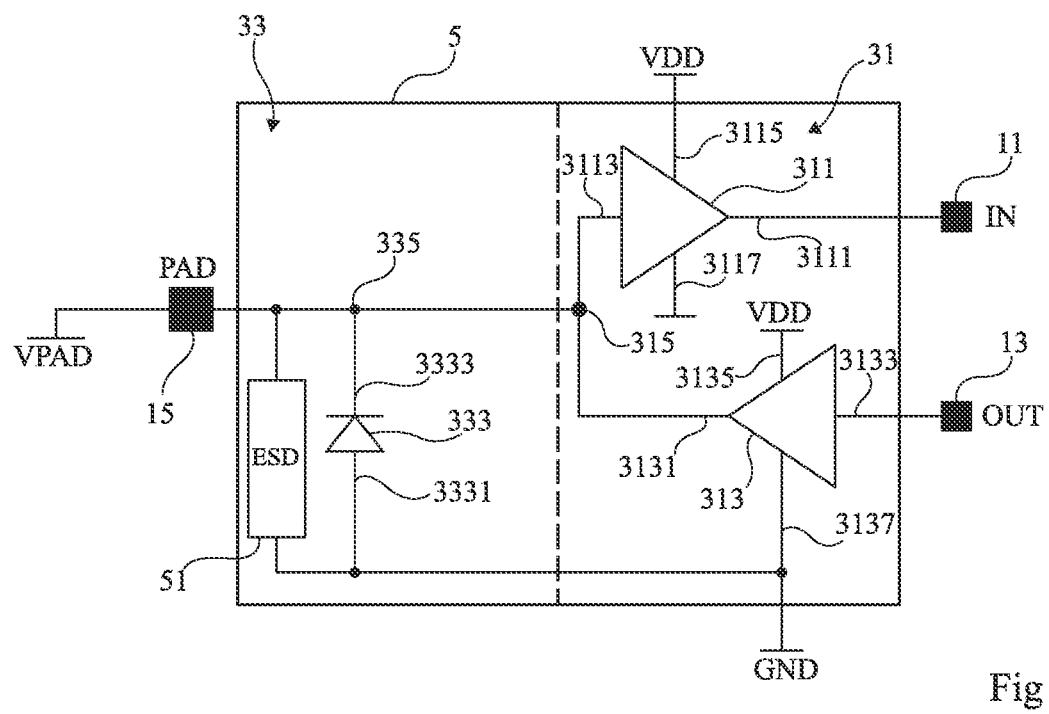
FIG. 3 illustrates, in a schematic fashion, a further example input-output circuit of an electronic chip.

FIG. 3 illustrates, in a schematic fashion, a further example input-output circuit 5 of an electronic chip.

The input-output circuit 5 shown in FIG. 3 is, for example, a further input-output circuit of the chip 1. This input-output circuit 5 comprises elements in common with the input-output circuit 3 shown in FIG. 2. These common elements will not be described again in detail in the following.

The input-output circuit 5 of FIG. 3 differs from the input-output circuit 3 of FIG. 2 mainly in that the circuit 5 does not comprise a diode 331. There is thus, in the input-output circuit 5, no possible path of injection toward the supply VDD.

The absence of the diode 331 (FIG. 2) allows the input-output circuit 5 shown in FIG. 3 to accept, on its pad 15, an expanded range of voltages compared to the range of admissible voltages of the circuit 3. This allows, for example, a chip 1 to use a same pad 15 to convey various types of signals as a function of one or more applications. It is thus in particular possible to apply, on the pad 15 of the circuit 5, a voltage VPAD substantially greater than VDD. This operation is also possible as it is possible by means of the design of the amplifiers 331 and 333 to support voltages greater than the voltage VDD on the pad 15 without risking a degradation of the components and without triggering an excessive leakage current that could alter the integrity of the signal applied on the pad 15. For a supply voltage VDD in the order of 3 V, a voltage VPAD in the order of 5 V can thus typically be imposed on the pad 15. The pad 15 of the circuit 5 is considered a "tolerant pad".

The protective circuit 33 comprises, in FIG. 3, an additional component 51 (ESD) by means of which it is possible to protect the levelling circuit 31 against possible electrostatic discharges. This component 51 is, in this example, connected in parallel to the diode 333.

However, the chip 1 is thus not protected against sustained positive voltages and it must be ensured that the application (connected to the pad 15) does not impose a positive voltage greater than what the components of the chip 1 can support. The protection ESD of the component 51, indeed, only protects against temporary overvoltages.

It is not possible with the input-output circuit 5 of the chip 1, however, to satisfy applications for which the diode 331 (FIG. 2) is needed. In other words, the circuits 3 (FIG. 2) and 5 each have different advantages, inherent in the presence or absence of the diode 331 (FIG. 2).

Figure 4:
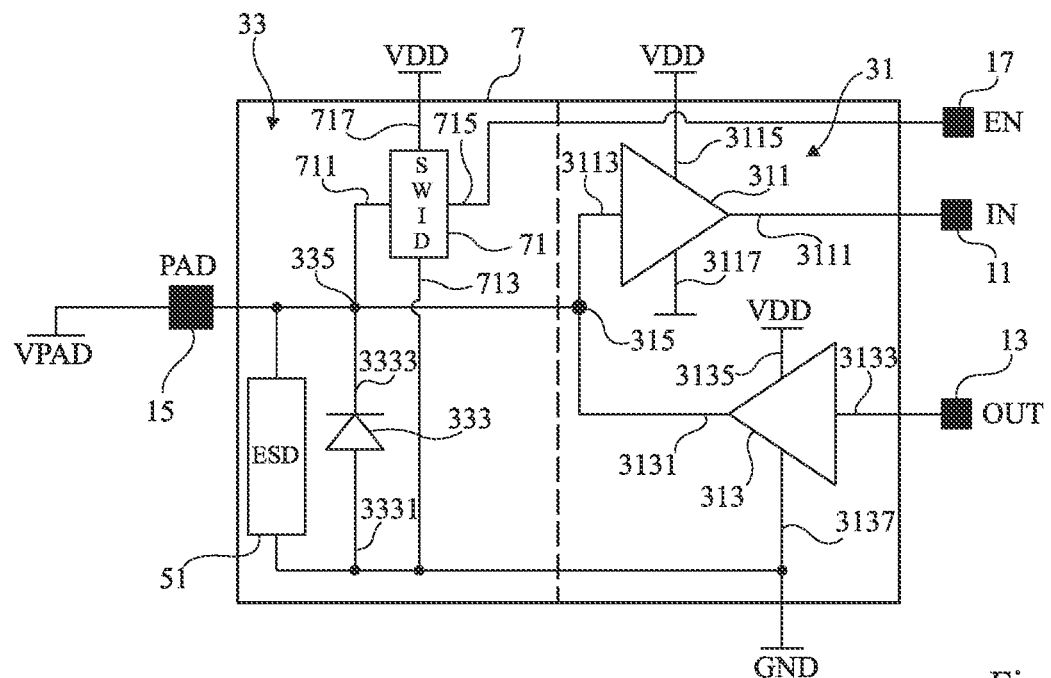
FIG. 4 illustrates, in a schematic fashion, an embodiment of an input-output circuit of an electronic chip.

FIG. 4 illustrates, in a schematic fashion, an embodiment of an input-output circuit 7 of an electronic chip.

According to this embodiment, the input-output circuit 7 shown in FIG. 4 is, for example, yet a further input-output circuit of the chip 1. This input-output circuit 7 comprises elements in common with the input-output circuit 5 shown in FIG. 3. These common elements will not be described again in detail in the following.

The input-output circuit 7 shown in FIG. 4 differs from the input-output circuit 5 shown in FIG. 3 mainly in that the circuit 7 comprises an additional component 71 (SWID), or switchable diode, and an additional terminal 17 (EN). The switchable diode 71 is, in FIG. 4, connected by a first connection pin 711, to the connection node 335, by a second connection pin 713, to ground GND, by a third connection pin 715, to the terminal 17 of the chip 1 and by a fourth connection pin 717, to a supply source (not illustrated) applying the potential VDD.

The terminal 17 is, preferably, on the side of the chip core (not illustrated in FIG. 4), which makes it possible to avoid modifying the number of pads external to the chip 1.

A digital signal (or ON/OFF signal), designated as CMD, is applied on the terminal 17 of the chip 1. The digital signal CMD thus reaches the switchable diode 71 by way of its third pin 715. This digital signal CMD is adapted to control the switchable diode 71.

According to a preferred embodiment, a first state, preferably a high state, of the control signal CMD allows the switchable diode 71 to behave like a diode in which an anode, corresponding to the first pin 711 of the switchable diode 71, is brought to the potential VPAD and a cathode, corresponding to the third pin 715 of the switchable diode 71, is brought to the potential VDD.

When the signal CMD is in the high state, everything works as if the input-output circuit 7 shown in FIG. 4 comprised a diode between the terminal 15 of the chip 1 and the supply VDD. In other words, the circuit 7 is thus comparable to the circuit 3 (FIG. 2), with the exception that the switchable diode 71 of the circuit 7 provides an injection path towards the ground GND while the diode 331 of the circuit 3 provides an injection path towards the supply VDD. When the signal CMD is in the high state, one thus reverts to an operation of the circuit 7 equivalent to that of the circuit 3 (FIG. 2), with the difference that a positive overvoltage (VPAD>VDD+VSEUIL) is no longer evacuated toward the supply VDD, but toward the ground GND.

According to this embodiment, a second state, preferably a low state, of the control signal CMD makes it possible to form, between the first pin 711 and the second pin 713 of the switchable diode 71, an open circuit.

When the signal CMD is in the low state, the circuit 7 is thus comparable to the circuit 5 shown in relation to FIG. 3.

When the signal CMD is in the low state, one thus reverts to an operation of the circuit 7 similar to that of the circuit 5 (FIG. 3).

Depending on the state of the signal CMD applied on the terminal 17 of the chip 1, it is thus possible to obtain, still in accordance with a preferred embodiment sometimes an intolerant pad 15, i.e. a component 71 behaving like a diode, when the signal CMD is in the high state and sometimes a tolerant pad 15, i.e. a component 71 behaving like an open circuit, when the signal CMD is in the low state.

Compared to the circuit 3 (FIG. 2) and the circuit 5 (FIG. 3), the circuit 7 of the chip 1 has the advantage that it possesses a configurable pad 15, as a tolerant pad or as an intolerant pad, as a function of the state of the digital signal CMD applied on the terminal 17 of the chip 1. This thus imparts a greater flexibility to the circuit 7 and, more specifically, to the chip 1.

Figure 5:
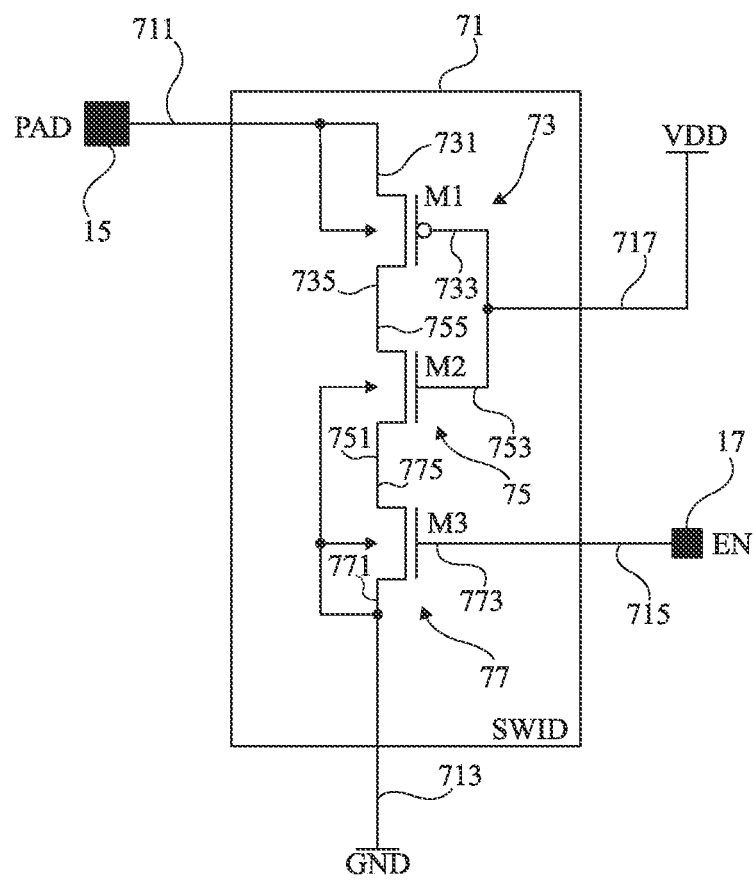
FIG. 5 illustrates, in a schematic fashion, an embodiment of a diode that is switchable by a digital signal.

FIG. 5 illustrates, in a schematic fashion, an embodiment of a diode that is switchable by a digital signal.

According to this embodiment, a switchable diode, for example the switchable diode 71 (SWID) of the circuit 7 (FIG. 4), is composed, preferably, of an assembly in series of a first transistor 73 (M1), of a second transistor 75 (M2) and of a third transistor 77 (M3).

The transistors 73, 75 and 77 of the switchable diode 71 are, preferably, field-effect transistors of the MOS type. In the example shown in FIG. 5, the transistors 75 and 77 of the switchable diode 71 have, compared to the transistor 73, a different type of conductivity. The transistor 71 is, preferably, a P-type or P-channel MOS transistor (or P-channel MOSFET, PFET, PMOS, etc.) while the transistors 75 and 77 are both N-type or N-channel MOS transistors (or N-channel MOSFET, NFET, NMOS, etc.).

According to a preferred embodiment, the first transistor 73 is such that a source 731 of the first transistor 73 is connected to the terminal 15 of the chip 1, a gate 733 of the first transistor 73 is brought to the supply potential VDD of the chip 1 and a drain 735 of the first transistor 73 is connected to a drain 755 of the second transistor 75.

The second transistor 75 is, still in accordance with this preferred embodiment, such that a source 751 of the second transistor 75 is connected to a drain 775 of the third transistor 77, a gate 753 of the second transistor 75 is brought to the supply potential VDD of the chip 1 and a drain 755 of the second transistor 75 is connected to the drain 735 of the first transistor 73.

The third transistor 77 is, still in accordance with this preferred embodiment, such that a source 771 of the third transistor 77 is grounded GND, a gate 773 of the third transistor 77 is connected to the terminal 17 of the chip 1 and the drain 775 of the third transistor 77 is connected to the source 751 of the second transistor 75.

Referring to the designations of FIG. 4: the source 731 of the first transistor 73 is connected to the first pin 711 of the switchable diode 71, the gate 733 of the first transistor 73 and the gate 753 of the second transistor 75 are interconnected to form the fourth pin 717 of the switchable diode 71, the gate 773 of the third transistor 77 is connected to the third pin 715 of the switchable diode 75 and the source 771 of the third transistor 77 is connected to the second pin 713 of the switchable diode 71.

The bulks of the transistors M2 and M3 are interconnected to the source 771 of the transistor M3 (ground GND). The bulk of the transistor M1 is connected to the source 731 of the transistor M1 (pad 15).

A DC voltage (VDD), preferably the supply voltage of the chip 1, is thus applied between: the common gates 733 and 753 of the first and second transistors 73 and 75 and the source 771 of the third transistor 77.

For the purposes of simplification, all the transistors 73, 75 and 77 are considered as having a same threshold voltage value, designated as VTH.

The first transistor 73 is theoretically on if a voltage higher than or equal to the voltage VTH is applied between its source 731 and its gate 733. The first transistor 73 is theoretically off if a voltage strictly lower than the voltage VTH is applied between its source 731 and its gate 733.

The second transistor 75 is theoretically on if a voltage greater than or equal to the voltage VTH is applied between its gate 753 and its source 751. The second transistor 75 is theoretically off if a voltage strictly lower than the threshold voltage VTH is applied between its gate 753 and its source 751.

The third transistor 77 is theoretically on if a voltage greater than or equal to the voltage VTH is applied between its gate 773 and its source 771. The second transistor 77 is theoretically off if a voltage strictly lower than the threshold voltage VTH is applied between its gate 773 and its source 771.

It has been observed in the foregoing that the source 731 of the first transistor 73 is connected to the pad 15 of the chip 1. The source 731 of the first transistor 73 is thus placed at the potential VPAD. The gate 773 of the third transistor 77 is connected to the terminal 17 of the chip 1. The gate 773 of the third transistor 77 is thus controlled by the digital signal CMD.

It is assumed that a high state (CMD=1) of the signal CMD is encoded by the application, on the terminal 17, of a voltage greater than or equal to VTH. The third transistor 77 is thus on when the signal CMD is in the high state.

It is assumed that a low state (CMD=0) of the signal CMD is encoded by the application, on the terminal 17, of a voltage strictly lower than VTH. The third transistor 77 is thus off when the signal CMD is in the low state.

A plurality of cases of operation of the switchable diode 71 can thus occur, as a function of the respective values of the potentials VDD and VPAD as well as of the digital signal CMD. These different cases of operation are listed in the table below.

TABLE 1

| Case | VDD | VPAD | CMD | Transistor 73 | Transistor 75 | Transistor 77 |
| --- | --- | --- | --- | --- | --- | --- |
| 1 | ≤VTH | <VDD + VTH | 0 | off | off | off |
| 2 | ≤VTH | ≥VDD + VTH | 0 | on | off | off |
| 3 | >VTH | <VDD + VTH | 0 | off | on | off |
| 4 | >VTH | ≥VDD + VTH | 0 | on | on | off |
| 5 | >VTH | <VDD + VTH | 1 | off | on | on |
| 6 | >VTH | ≥VDD + VTH | 1 | on | on | on |

A current can thus theoretically only flow, between the terminal 15 and the ground GND of the chip 1, if all transistors 73, 75 and 77 of the switchable diode 71 are on. Based on the table above, it is evident that the switchable diode 71 is only on in case 6. The switchable diode 71 is thus on if the voltage VPAD is greater than or equal to VDD+VTH, if the signal CMD is in the high state and if the voltage VDD is greater than the threshold voltage VTH.

When the signal CMD is in the high state (case 5 and case 6), the switchable diode 71 thus behaves like a diode characterized by a threshold voltage equal to VTH. When the signal CMD is in the low state (cases 1 to 4), the switchable diode 71 behaves, on the other hand, like an open circuit.

The switchable diode 71 distinguishes itself from the diode 331 (FIG. 2) in that it prohibits any injection of current toward the supply VDD when the chip 1 is disconnected from a voltage supply (i.e. when the supply of the chip 1 is turned off, VDD=0).

Assuming that the voltage VDD is zero, i.e. that it is desired to keep the chip 1 switched off or disconnected from a voltage supply, the application of a voltage to a pad 15 associated with a diode 331 (as shown in relation to FIG. 2) can cause an injection of current toward the supply VDD. There is thus a risk of preventing the disconnection or switching off of the chip 1. On the other hand, the application of a voltage to a pad 15 associated with a switchable diode 71 cannot cause an injection of current toward the supply VDD. The chip 1 is thus kept disconnected or switched off.

The switchable diode 71 has, as a consequence, the advantage of preventing the chip 1 that it is desired to keep disconnected from being involuntarily resupplied by the application of a voltage on the pad 15.

Various embodiments and variants have been described. Those skilled in the art will understand that certain features of these embodiments can be combined and other variants will readily occur to those skilled in the art. In particular, what has been shown more specifically in relation to an example application to an input-output circuit applies more generally to any electronic circuit in which it is desired to realize a switchable diode 71.

Finally, the practical implementation of the embodiments and variants described herein is within the capabilities of those skilled in the art based on the functional description provided hereinabove.

What is claimed is:

1. An electronic chip comprising:
a chip core comprising an input terminal and an output terminal;
an external connection pad;
an input-output circuit coupled between the chip core and the external connection pad, the input-output circuit being configured to facilitate exchange of digital signals between the chip core and circuitry coupled to the external pad, wherein the input-output circuit comprises a switchable diode device coupled between a supply voltage and the external connection pad, the switchable diode device comprising an enable terminal coupled to the chip core, and a connection terminal coupled to the external pad; wherein the switchable diode device is configured to
operate as a diode comprising a threshold voltage in response to a control signal in a first state applied to the enable terminal, and
to operate as an open circuit in response to the control signal in a second state applied to the enable terminal; and
wherein the input-output circuit is configured to provide a digital signal comprising a voltage greater than the sum of the supply voltage and the threshold voltage to the input terminal of the chip core in response to the control signal in the second state being applied to the enable terminal while the digital signal is being applied to the external connection pad.

2. The electronic chip according to claim 1, wherein the input-output circuit further comprises a diode comprising a cathode coupled to the connection terminal, and an anode coupled to the reference voltage.

3. The electronic chip according to claim 1, wherein the input-output circuit further comprises an electrostatic discharge protection circuit coupled to the connection terminal and the reference voltage.

4. The electronic chip according to claim 1, wherein the switchable diode device comprises a first transistor connected to the reference voltage, the first transistor comprising a gate connected to the enable terminal.

5. The electronic chip according to claim 4, wherein the switchable diode device comprises
a second transistor connected to the external pad, and
a third transistor connected to the second transistor and the first transistor, and
the second transistor and the third transistor each comprise a gate directly connected to the supply voltage.

6. The electronic chip according to claim 5, wherein
the first transistor is an N-type transistor,
the second transistor is a P-type transistor, and
the third transistor is an N-type transistor.

7. The electronic chip according to claim 1, wherein the switchable diode device comprises a current path between the external pad and the reference voltage controlled by the control signal.

8. The electronic chip according to claim 7, wherein the current path comprises a transistor connected to the reference voltage, the transistor comprising a gate connected to the enable terminal.

9. A method of applying a digital signal to a chip core of an electronic chip, the method comprising:
applying a first control signal to an enable terminal of a switchable diode device of an input-output circuit of an electronic chip, the first control signal causing the switchable diode device to operate as a diode comprising a first threshold voltage,
wherein the input-output circuit is coupled between an external connection pad of the electronic chip and a chip core of the electronic chip, and
wherein the switchable diode device is coupled between a supply voltage and the external connection pad;
applying a second control signal to the enable terminal of the switchable diode device, the second control signal causing the switchable diode device to operate as an open circuit;
applying a first digital signal to the external connection pad while applying the second control signal to the enable terminal, the first digital signal comprising a voltage greater than the sum of the supply voltage and the first threshold voltage; and
providing the first digital signal to an input terminal of the chip core through the input-output circuit.

10. The method according to claim 9, further comprising:
applying a negative overvoltage to the external connection pad, the negative overvoltage comprising a voltage less than the difference between a reference voltage and a second threshold voltage of a diode comprising a cathode coupled to the external connection pad and an anode coupled to the reference voltage; and
preventing the negative overvoltage from being applied to the input terminal of the chip core.

11. The method according to claim 9, further comprising:
applying a second digital signal to the external connection pad while applying the first control signal to the enable terminal, the second digital signal comprising a voltage between the sum of the supply voltage and the first threshold voltage, and the difference between a reference voltage and a second threshold voltage of a diode comprising a cathode coupled to the external connection pad and an anode coupled to the reference voltage; and providing the second digital signal to the input terminal of the chip core through the input-output circuit.

12. The method according to claim 11, further comprising:

applying a sustained positive overvoltage to the external connection pad while applying the first control signal to the enable terminal, the sustained positive overvoltage comprising a voltage greater than the sum of the supply voltage and the first threshold voltage; and preventing the sustained positive overvoltage from being applied to the input terminal of the chip core.

13. The method according to claim 11, further comprising:

applying a third digital signal to the external connection pad while applying the first control signal to the enable terminal, the third digital signal comprising a voltage greater than the sum of the supply voltage and the first threshold voltage; and preventing the third digital signal from being applied to the input terminal of the chip core.

14. The method according to claim 9, further comprising:

applying a temporary overvoltage to the external connection pad while applying the second control signal to the enable terminal, the temporary overvoltage comprising a voltage greater than that which the chip core can support; and preventing the temporary overvoltage from being applied to the input terminal of the chip core by passing the temporary overvoltage through an electrostatic discharge protection circuit connected between the external connection pad and a reference voltage.

15. The method of claim 9, further comprising protecting the electronic chip by:

switching off or disconnecting the electronic chip from the supply voltage to switch the electronic chip off;

causing the switchable diode device to operate as an open circuit;

applying a voltage to the external connection pad; and preventing the electronic chip from being switched on while the voltage is applied to the external connection pad using the operation of the switchable diode device as the open circuit.

16. The method according to claim 15, wherein switching off the electronic chip comprises applying zero voltage to a supply voltage node connected to the chip core.

17. The method according to claim 15, wherein causing the switchable diode device to operate as the open circuit comprises switching off the switchable diode device by applying a digital signal to an enable terminal of the switchable diode device.

18. The method according to claim 17, wherein the switchable diode device comprises a transistor connected to a reference voltage, and the transistor comprises a gate connected to the enable terminal.

19. The method according to claim 15, wherein causing the switchable diode device to operate as the open circuit comprises disconnecting the switchable diode device from the supply voltage.

20. The electronic chip of claim 1, further comprising:

a levelling circuit coupled to the connection terminal and comprising an input coupled to the input terminal of the chip core, and an output coupled to the output terminal of the chip core.

* * * * *